(12) United States Patent
Zhang et al.

(10) Patent No.: US 12,740,093 B2
(45) Date of Patent: Sep. 15, 2026

(54) QUASI-VERTICAL POWER DEVICE

(71) Applicant: Virginia Tech Intellectual Properties, Inc., Blacksburg, VA (US)

(72) Inventors: Yuhao Zhang, Blacksburg, VA (US); Yuan Qin, Blacksburg, VA (US)

(73) Assignee: VIRGINIA POLYTECHNIC INSTITUTE AND STATE UNIVERSITY, Blacksburg, VA (US)

(*) Notice: Subject to any disclaimer, the term of this patent is extended or adjusted under 35 U.S.C. 154(b) by 261 days.

(21) Appl. No.: 18/486,880

(22) Filed: Oct. 13, 2023

(65) Prior Publication Data

US 2025/0126834 A1 Apr. 17, 2025

(51) Int. Cl.

*H10D 30/66* (2025.01)
*H10D 8/00* (2025.01)
*H10D 30/83* (2025.01)
*H10D 62/85* (2025.01)

(52) U.S. Cl.

CPC ............. *H10D 30/66* (2025.01); *H10D 8/422* (2025.01); *H10D 30/831* (2025.01); *H10D 62/8503* (2025.01)

(58) Field of Classification Search

CPC .. H10D 30/66; H10D 62/8503; H10D 30/831; H10D 8/422

See application file for complete search history.

(56) References Cited

U.S. PATENT DOCUMENTS

| | | | | |
|---|---|---|---|---|
| 6,693,338 | B2 | 2/2004 | Saitoh et al. | |
| 6,919,610 | B2 | 7/2005 | Saitoh et al. | |
| 7,553,747 | B2 | 6/2009 | Hirose et al. | |
| 9,178,013 | B2 * | 11/2015 | Schmidt | H10D 62/105 |
| 10,170,563 | B2 | 1/2019 | Zhu | |
| 2019/0157511 | A1 * | 5/2019 | Dai | H10H 20/812 |

OTHER PUBLICATIONS

Y. Zhang, F. Udrea, and H. Wang, "Multidimensional device architectures for efficient power electronics," Nat. Electron., vol. 5, No. 11, Art. No. 11, Nov. 2022, doi: 10.1038/s41928-022-00860-5.

(Continued)

*Primary Examiner* — Richard A Booth
(74) *Attorney, Agent, or Firm* — Thomas | Horstemeyer, LLP

(57) ABSTRACT

A device may include a substrate. A device may include a first semiconductor region of a first conductivity type having a first doping concentration, the first semiconductor region including a base surface, a buffer region positioned between the substrate and the first semiconductor region. A device may include a second semiconductor region of the first conductivity type and having a second doping concentration that is less than the first doping concentration, the second semiconductor region positioned over the base surface of the first semiconductor region. A device may include at least one first device terminal positioned over the base surface of the first semiconductor region. A device may include a third semiconductor region of a second conductivity type disposed over at least one sidewall of the second semiconductor region.

15 Claims, 11 Drawing Sheets

(56) References Cited

OTHER PUBLICATIONS

K. J. Chen, O. Häberlen, A. Lidow, C. Iin Tsai, T. Ueda, Y. Uemoto, and Y. Wu, "GaN-on-Si Power Technology: Devices and Applications," IEEE Trans. Electron Devices, vol. 64, No. 3, pp. 779-795, Mar. 2017, doi: 10.1109/TED.2017.2657579.

M. Xiao, Y. Ma, K. Liu, K. Cheng, and Y. Zhang, "10 KV, 39 mΩ•cm2 Multi-Channel AlGaN/GaN Schottky Barrier Diodes," IEEE Electron Device Lett., vol. 42, No. 6, pp. 808-811, Jun. 2021, doi: 10.1109/LED.2021.3076802.

M. Xiao, Y. Ma, Z. Du, V. Pathirana, K. Cheng, A. Xie, E. Beam, Y. Cao, F. Udrea, H. Wang, and Y. Zhang, "Multi-Channel Monolithic-Cascode HEMT (MC2-HEMT): A New GaN Power Switch up to 10KV," in 2021 IEEE International Electron Devices Meeting (IEDM), Dec. 2021, p. 5.5.1-5.5.4. doi: 10.1109/IEDM19574.2021.9720714.

Y. Zhang and T. Palacios, "(Ultra)Wide-Bandgap Vertical Power FinFETs," IEEE Trans. Electron Devices, vol. 67, No. 10, pp. 3960-3971, Oct. 2020, doi: 10.1109/TED.2020.3002880.

J. Liu, R. Zhang, M. Xiao, S. Pidaparthi, H. Cui, A. Edwards, L. Baubutr, C. Drowley, and Y. Zhang, "Surge Current and Avalanche Ruggedness of 1.2-kV Vertical GaN p-n Diodes," IEEE Trans. Power Electron., vol. 36, No. 10, pp. 10959-10964, Oct. 2021, doi: 10.1109/TPEL.2021.3067019.

T. Oka, "Recent development of vertical GaN power devices," Jpn. J. Appl. Phys., vol. 58, No. SB, p. SB0805, Apr. 2019, doi: 10.7567/1347-4065/ab02e7.

J. Liu, M. Xiao, R. Zhang, S. Pidaparthi, H. Cui, A. Edwards, M. Craven, L. Baubutr, C. Drowley, and Y. Zhang, "1.2-kV Vertical GaN Fin-JFETs: High-Temperature Characteristics and Avalanche Capability," IEEE Trans. Electron Devices, vol. 68, No. 4, pp. 2025-2032, Apr. 2021, doi: 10.1109/TED.2021.3059192.

Y. Zhang, A. Dadgar, and T. Palacios, "Gallium nitride vertical power devices on foreign substrates: a review and outlook," J. Phys. Appl. Phys., vol. 51, No. 27, p. 273001, Jul. 2018, doi: 10.1088/1361-6463/aac8aa.

Y. Zhang, M. Sun, D. Piedra, M. Azize, X. Zhang, T. Fujishima, and T. Palacios, "GaN-on-Si Vertical Schottky and p-n Diodes," IEEE Electron Device Lett., vol. 35, No. 6, pp. 618-620, Jun. 2014, doi: 10.1109/LED.2014.2314637.

Y. Zhang, D. Piedra, M. Sun, J. Hennig, A. Dadgar, L. Yu, and T. Palacios, "High-Performance 500 V Quasi- and Fully-Vertical GaN-on-Si pn Diodes," IEEE Electron Device Lett., vol. 38, No. 2, pp. 248-251, Feb. 2017, doi: 10.1109/LED.2016.2646669.

X. Zhang, X. Zou, X. Lu, C. W. Tang, and K. M. Lau, "Fully- and Quasi-Vertical GaN-on-Si p-i-n Diodes: High Performance and Comprehensive Comparison," IEEE Trans. Electron Devices, vol. 64, No. 3, pp. 809-815, Mar. 2017, doi: 10.1109/TED.2017.2647990.

R. Abdul Khadar, C. Liu, L. Zhang, p. Xiang, K. Cheng, and E. Matioli, "820-V GaN-on-Si Quasi-Vertical p-i-n Diodes With BFOM of 2.0 GW/cm2," IEEE Electron Device Lett., vol. 39, No. 3, pp. 401-404, Mar. 2018, doi: 10.1109/LED.2018.2793669.

Y. Li, M. Wang, R. Yin, J. Zhang, M. Tao, B. Xie, Y. Hao, X. Yang, C. P. Wen, and B. Shen, "Quasi-Vertical GaN Schottky Barrier Diode on Silicon Substrate With 1010 High On/Off Current Ratio and Low Specific On-Resistance," IEEE Electron Device Lett., vol. 41, No. 3, pp. 329-332, Mar. 2020, doi: 10.1109/LED.2020.2968392.

X. Guo, Y. Zhong, J. He, Y. Zhou, S. Su, X. Chen, J. Liu, H. Gao, X. Sun, Q. Zhou, Q. Sun, and H. Yang, "High-Voltage and High-ION/IOFF Quasi-Vertical GaN-on-Si Schottky Barrier Diode With Argon-Implanted Termination," IEEE Electron Device Lett., vol. 42, No. 4, pp. 473-476, Apr. 2021, doi: 10.1109/LED.2021.3058380.

X. Guo, Y. Zhong, Y. Zhou, S. Su, X. Chen, S. Yan, J. Liu, X. Sun, Q. Sun, and H. Yang, "Nitrogen-Implanted Guard Rings for 600-V Quasi-Vertical GaN-on-Si Schottky Barrier Diodes With a BFOM of 0.26 GW/cm2," IEEE Trans. Electron Devices, vol. 68, No. 11, pp. 5682-5686, Nov. 2021, doi: 10.1109/TED.2021.3108951.

R. M. A. Khadar, A. Floriduz, T. Wang, and E. Matioli, "p-NiO junction termination extensions for GaN power devices," Appl. Phys. Express, Jun. 2021, doi: 10.35848/1882-0786/ac09ff.

X. Guo, Y. Zhong, Y. Zhou, X. Chen, S. Yan, J. Liu, X. Sun, Q. Sun, and H. Yang, "1200-V GaN-on-Si Quasi-Vertical p-n Diodes," IEEE Electron Device Lett., vol. 43, No. 12, pp. 2057-2060, Dec. 2022, doi: 10.1109/LED.2022.3219103.

X. Zou, X. Zhang, X. Lu, C. W. Tang, and K. M. Lau, "Fully Vertical GaN p-i-n Diodes Using GaN-on-Si Epilayers," IEEE Electron Device Lett., vol. 37, No. 5, pp. 636-639, May 2016, doi: 10.1109/LED.2016.2548488.

S. Mase, Y. Urayama, T. Hamada, J. J. Freedsman, and T. Egawa, "Novel fully vertical GaN p-n diode on Si substrate grown by metalorganic chemical vapor deposition," Appl. Phys. Express, vol. 9, No. 11, p. 111005, Nov. 2016, doi: 10.7567/APEX.9.111005.

K. Zhang, S. Mase, K. Nakamura, T. Hamada, and T. Egawa, "Demonstration of fully vertical GaN-on-Si Schottky diode," Electron. Lett., vol. 53, No. 24, pp. 1610-1611, Oct. 2017, doi: 10.1049/el.2017.3166.

Y. Zhang, M. Yuan, N. Chowdhury, K. Cheng, and T. Palacios, "720-V/0.35-mΩ•cm2 Fully Vertical GaN-on-Si Power Diodes by Selective Removal of Si Substrates and Buffer Layers," IEEE Electron Device Lett., vol. 39, No. 5, pp. 715-718, May 2018, doi: 10.1109/LED.2018.2819642.

C. Liu, R. A. Khadar, and E. Matioli, "GaN-on-Si Quasi-Vertical PowerMOSFETs," IEEE Electron Device Lett., vol. 39, No. 1, pp. 71-74, Jan. 2018, doi: 10.1109/LED.2017.2779445.

R. A. Khadar, C. Liu, R. Soleimanzadeh, and E. Matioli, "Fully Vertical GaN-on-Si power MOSFETs," IEEE Electron Device Lett., vol. 40, No. 3, pp. 443-446, Mar. 2019, doi: 10.1109/LED.2019.2894177.

Y. Zhang, M. Sun, H. Wong, Y. Lin, p. Srivastava, C. Hatem, M. Azize, D. Piedra, L. Yu, T. Sumitomo, N. A. de Braga, R. V. Mickevicius, and T. Palacios, "Origin and Control of Off-State Leakage Current in GaNon-Si Vertical Diodes," IEEE Trans. Electron Devices, vol. 62, No. 7, pp. 2155-2161, Jul. 2015, doi: 10.1109/TED.2015.2426711.

C. Park, N. Hong, D. J. Kim, and K. Lee, "A new junction termination technique using ICP RIE for ideal breakdown voltages," in Proceedings of the 14th International Symposium on Power Semiconductor Devices and Ics, Jun. 2002, pp. 257-260. doi: 10.1109/ISPSD.2002.1016220.

T. T. H. Nguyen, M. Lazar, J. L. Augé, H. Morel, L. V. Phung, and D. Planson, "Vertical Termination Filled with Adequate Dielectric for SiC Devices in HVDC Applications," Mater. Sci. Forum, vol. 858, pp. 982-985, May 2016, doi: 10.4028/www.scientific.net/MSF.858.982.

H. Fukushima, S. Usami, M. Ogura, Y. Ando, A. Tanaka, M. Deki, M. Kushimoto, S. Nitta, Y. Honda, and H. Amano, "Vertical GaN p-n diode with deeply etched mesa and the capability of avalanche breakdown," Appl. Phys. Express, vol. 12, No. 2, p. 026502, Feb. 2019, doi: 10.7567/1882-0786/aafdb9.

H. Kim, "Reactive ion etching damage in n-GaN and its recovery by post-etch treatment," Electron. Lett., vol. 44, No. 17, pp. 1037-1039, Aug. 2008, doi: 10.1049/el:20081771.

J. A. Spencer, A. L. Mock, A. G. Jacobs, M. Schubert, Y. Zhang, and M. J. Tadjer, "A review of band structure and material properties of transparent conducting and semiconducting oxides: Ga2O3, Al2O3, In2O3, ZnO, SnO2, CdO, NiO, CuO, and Sc2O3," Appl. Phys. Rev., vol. 9, No. 1, p. 011315, Mar. 2022, doi: 10.1063/5.0078037.

M. Xiao, Y. Ma, Z. Du, Y. Qin, K. Liu, K. Cheng, F. Udrea, A. Xie, E. Beam, B. Wang, J. Spencer, M. Tadjer, T. Anderson, H. Wang, and Y. Zhang, "First Demonstration of Vertical Superjunction Diode in GaN," in 2022 International Electron Devices Meeting (IEDM), Dec. 2022, p. 35.6.1-35.6.4. doi: 10.1109/IEDM45625.2022.10019405.

Q. Zhou, M. O. Manasreh, M. Pophristic, S. Guo, and I. T. Ferguson, "Observation of nitrogen vacancy in proton-irradiated AlxGa1-xN," Appl. Phys. Lett., vol. 79, No. 18, pp. 2901-2903, Oct. 2001, doi: 10.1063/1.1415422.

(56) References Cited

OTHER PUBLICATIONS

B. Wang, M. Xiao, J. Spencer, Y. Qin, K. Sasaki, M. J. Tadjer, and Y. Zhang, "2.5 kV Vertical Ga2O3 Schottky Rectifier With Graded Junction Termination Extension," IEEE Electron Device Lett., vol. 44, No. 2, pp. 221-224, Feb. 2023, doi: 10.1109/LED.2022.3229222.

H. Zhou, S. Zeng, J. Zhang, Z. Liu, Q. Feng, S. Xu, J. Zhang, and Y. Hao, "Comprehensive Study and Optimization of Implementing p-NiO in β-Ga2O3 Based Diodes via TCAD Simulation," Crystals, vol. 11, No. 10, p. 1186, Sep. 2021, doi: 10.3390/cryst11101186.

R. Zhang, J. P. Kozak, M. Xiao, J. Liu, and Y. Zhang, "Surge-Energy and Overvoltage Ruggedness of P-Gate GaN HEMTs," IEEE Trans. Power Electron., vol. 35, No. 12, pp. 13409-13419, Dec. 2020, doi: 10.1109/TPEL.2020.2993982.

* cited by examiner

QUASI-VERTICAL POWER DEVICE

TECHNICAL FIELD

This disclosure relates to the semiconductor devices, and in particular to quasi-vertical power devices.

DESCRIPTION OF THE RELATED TECHNOLOGY

Gallium nitride (GaN) has become a mainstream power semiconductor owing to its superior physical properties over silicon (Si) and silicon carbide (SiC) [1]. Lateral GaN devices have been commercialized from 15 V to 900 V [2] and demonstrated up to 10 kV [3], [4]. Vertical devices promise superior power capacity [5] and robustness [6] as compared to lateral devices. Vertical GaN devices are being commercialized globally [7], [8], but the GaN wafer on native substrate is still more costly as compared to SiC and Si wafers.

SUMMARY

In some aspects, the techniques described herein relate to a semiconductor device, including: a substrate; a first semiconductor region of a first conductivity type having a first doping concentration, the first conductivity type being one of a n-type conductivity and a p-type conductivity, the first semiconductor region including a base surface; a buffer region positioned between the substrate and the first semiconductor region; a second semiconductor region of the first conductivity type and having a second doping concentration that is less than the first doping concentration, the second semiconductor region positioned over the base surface of the first semiconductor region; at least one first device terminal positioned over the base surface of the first semiconductor region; a third semiconductor region of a second conductivity type, the second conductivity type being the other of the n-type conductivity and the p-type conductivity, disposed over at least one sidewall of the second semiconductor region, a bandgap of the third semiconductor region is greater than or equal to a bandgap of the second semiconductor region; and at least one second device terminal positioned over a top surface of the second semiconductor region and in contact with the third semiconductor region.

In some aspects, the techniques described herein relate to a semiconductor device, wherein the third semiconductor region is disposed over at least half a height of the at least one sidewall of the second semiconductor region.

In some aspects, the techniques described herein relate to a semiconductor device, wherein the third semiconductor region is disposed over the entire height of the at least one sidewall of the second semiconductor region.

In some aspects, the techniques described herein relate to a semiconductor device, wherein the third semiconductor region is also disposed over at least a portion of the at least one second device terminal.

In some aspects, the techniques described herein relate to a semiconductor device, wherein the at least one second device terminal covers at least a portion of the third semiconductor region disposed over at least one sidewall of the second semiconductor region.

In some aspects, the techniques described herein relate to a semiconductor device, further including: a dielectric region disposed over at least a portion of the second semiconductor region and at least a portion of the third semiconductor region, wherein the at least one second terminal is positioned over at least a portion of the dielectric region.

In some aspects, the techniques described herein relate to a semiconductor device, further including: at least one ion implantation region in the second semiconductor region, wherein the at least one ion implantation region is in contact with both the at least one second device terminal and the third semiconductor region.

In some aspects, the techniques described herein relate to a semiconductor device, further including: a comb structure formed in the second semiconductor region in contact with the at least one second device terminal, wherein the comb structure is formed using a material having the second conductivity type, and wherein a bandgap of the comb structure is greater than or equal to the bandgap of the second semiconductor region.

In some aspects, the techniques described herein relate to a semiconductor device, further including: a dielectric region disposed over at least a portion of the second semiconductor region and at least a portion of the third semiconductor region, wherein the at least one second terminal is positioned over at least a portion of the dielectric region.

In some aspects, the techniques described herein relate to a semiconductor device, further including: at least one ion implantation region in the second semiconductor region, wherein the at least one ion implantation region is in contact with both the at least one second device terminal and the third semiconductor region.

In some aspects, the techniques described herein relate to a semiconductor device, further including: a fourth semiconductor region of the second conductivity type positioned between the second semiconductor region and the at least one second device terminal.

In some aspects, the techniques described herein relate to a semiconductor device, wherein the semiconductor device is a metal-oxide-semiconductor-field-effect-transistor (MOSFET), and wherein the at least one first device terminal includes a drain terminal and the at least one second device terminal includes a source terminal and a gate terminal.

In some aspects, the techniques described herein relate to a semiconductor device, wherein the semiconductor device is a junction-field-effect-transistor (JFET), and wherein the at least one first device terminal includes a drain terminal and the at least one second device terminal includes a source terminal and a gate terminal.

In some aspects, the techniques described herein relate to a semiconductor device, wherein the first semiconductor region and the second semiconductor region include gallium-nitride.

In some aspects, the techniques described herein relate to the semiconductor device of claim A14, wherein the third semiconductor region includes gallium-nitride.

BRIEF DESCRIPTION OF THE DRAWINGS

Like reference numbers and designations in the various drawings indicate like elements.

DETAILED DESCRIPTION

Figure 1:
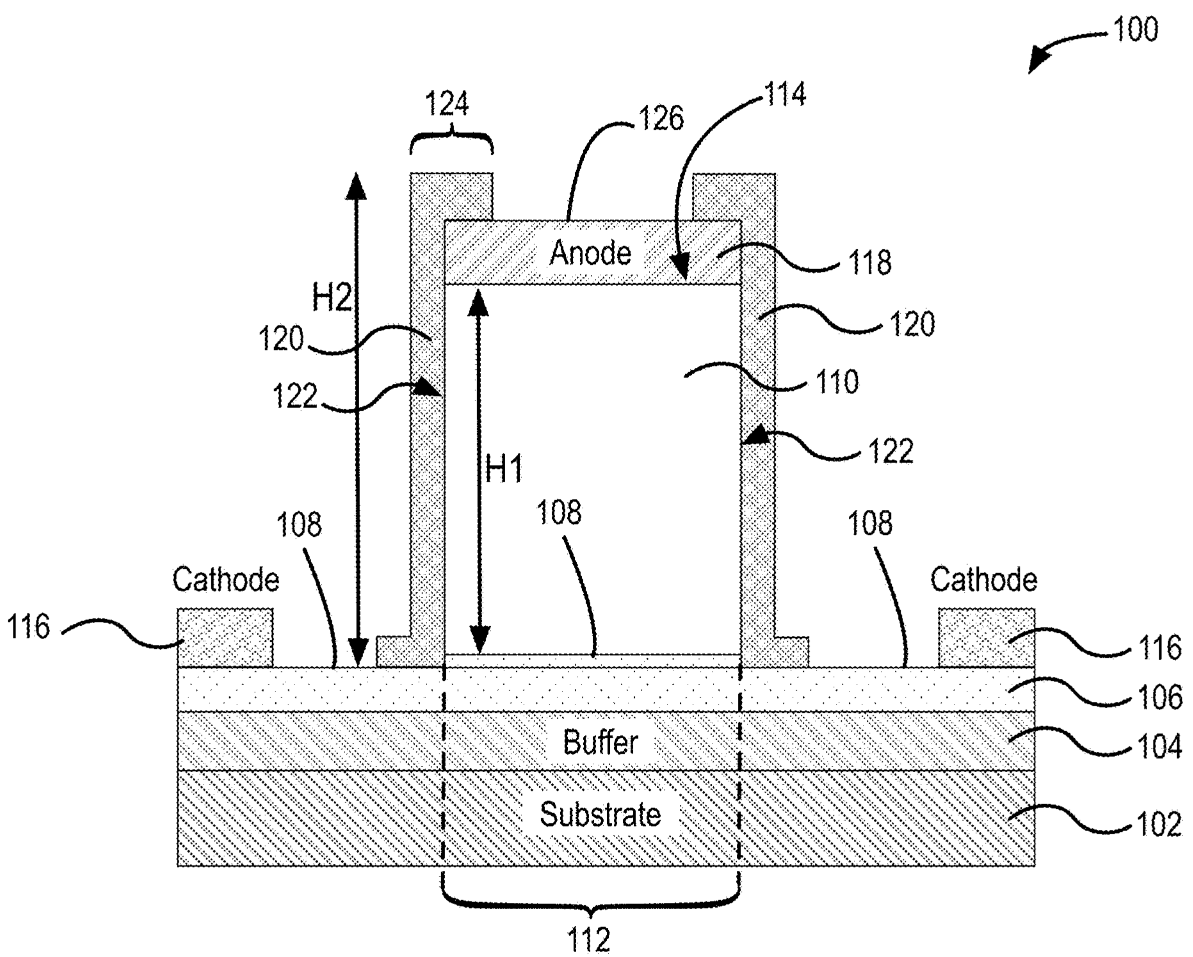
FIG. 1 shows a first example semiconductor device such as, for example a Schottky barrier diode.

The various concepts introduced above and discussed in greater detail below may be implemented in any of numerous ways, as the described concepts are not limited to any particular manner of implementation. Examples of specific implementations and applications are provided primarily for illustrative purposes.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

Prior to describing the various aspects of the present disclosure, the following definitions are provided and should be used unless otherwise indicated. Additional terms may be defined elsewhere in the present disclosure.

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of.

As used herein, the term "and/or" includes any and all combinations of one or more of the associated listed items. Expressions such as "at least one of," when preceding a list of elements, modify the entire list of elements and do not modify the individual elements of the list.

As used in the specification and the appended claims, the singular forms "a," "an" and "the" include plural referents unless the context clearly dictates otherwise. Thus, for example, reference to "a proton beam degrader," "a degrader foil," or "a conduit," includes, but is not limited to, two or more such proton beam degraders, degrader foils, or conduits, and the like.

The various concepts introduced above and discussed in greater detail below may be implemented in any of numerous ways, as the described concepts are not limited to any particular manner of implementation. Examples of specific implementations and applications are provided primarily for illustrative purposes.

As used herein, the terms "optional" or "optionally" means that the subsequently described event or circumstance can or cannot occur, and that the description includes instances where said event or circumstance occurs and instances where it does not.

Unless otherwise specified, temperatures referred to herein are based on atmospheric pressure (i.e. one atmosphere).

Vertical GaN-on-Si have the potential to reduce material cost and allow larger-diameter processing [9]. Many power devices [10] such as, GaN-on-Si quasi-vertical diodes [11]-[18], fully vertical diodes [19]-[22], and MOSFETs [23], [24] that utilize GaN-on-Si have been demonstrated. Upscaling the breakdown voltage (BV) can be beneficial to make this device technology competitive for class applications that operate at 100s of volts of BV. Some GaN-on-Si p-n diodes can have a BV of more than one kV [18], but BV of Schottky barrier diodes (SBDs) and MOSFETs can be substantially below this value [16], [24]. Due to the high turn-on voltage, GaN p-n diode may be less desirable for direct use in power electronics applications. As the GaN epitaxy thickness is limited on Si substrate [9], edge termination design can be an important factor for realizing high BV, and it is particularly challenging for SBDs due to the high surface electric field (E-field). In some GaN-on-Si SBDs, implanted guard rings can be employed [15], [16], [25].

The devices discussed herein address one or more challenges discussed above. For example, one or more sidewalls of mesas formed of GaN can be covered with a semiconductor material that has a type that is opposite of the type of the GaN mesa. The GaN material and the semiconductor material disposed on the sidewalls can form a reduced surface field (RESURF) structure. The RESURF structure can mitigate electric field crowding caused by the presence of donor traps introduced on the GaN sidewalls by damage caused during the etching process. The resulting device reduces electric field crowding and improves the BV of the device.

FIG. 1 shows a first example semiconductor device 100. In particular, the first example semiconductor device 100 is a Schottky barrier diode (SBD). The first example semiconductor device 100 includes a substrate 102, and a buffer region 104 disposed over the substrate 102. A first semiconductor region 106 of a first conductivity type having a first doping concentration is disposed over the buffer region 104 resulting in the buffer region 104 being positioned between the substrate 102 and the first semiconductor region 106. The first semiconductor region 106 has a conductivity type that is one of a n-type conductivity and a p-type conductivity. The substrate 102 and the first semiconductor region 106 can be formed of different materials. For example, the substrate 102 can be formed of silicon, sapphire, aluminum nitride, silicon carbide, diamond, etc., while the first semiconductor region 106 can be formed of GaN, aluminum nitride, aluminum gallium nitride, etc. In some instances, the buffer region 104 can include un-intentionally doped GaN, aluminum nitride (AlN), or aluminum gallium nitride (AlGaN) to interface between the substrate 102 and the first semiconductor region 106. The buffer region 104, for example, can have a coefficient of expansion that is between the coefficient of expansions of the substrate 102 and the first semiconductor region 106.

The first semiconductor region 106 can include a base surface 108 over which a second semiconductor region 110 is disposed. In particular, the second semiconductor region 110 is disposed over a portion 112 of the base surface 108. The second semiconductor region 110 can be of the same conductivity type as the first semiconductor region 106. For example, if the first semiconductor region 106 is n-type (p-type), then the second semiconductor region 110 can also be n-type (p-type). In some examples, the doping concentration of the second semiconductor region 110 can be less than the doping concentration of the first semiconductor region 106. For instance, the second semiconductor region 110 can be an $n^-$—GaN while the first semiconductor region 106 can be an $n^+$—GaN. The higher doping concentration of the first semiconductor region 106 can help spread the current from the drift region formed in part by the second semiconductor region 110 towards the at least one first device terminal 116. In some examples, the doping concentration of the second semiconductor region 110 can be between about $10^{15}$ $cm^{-3}$ and about $10^{17}$ $cm^{-3}$ and the doping concentration of the first semiconductor region 106 can be between about $10^{18}$ $cm^{-3}$ and about $10^{20}$ $cm^{-3}$. The second semiconductor region 110 can form a drift layer while the first semiconductor region 106 can form a current spreading layer. The second semiconductor region 110 can have a height H1 measured between the base surface 108 of the first semiconductor region 106 and a top surface 114 of the second semiconductor region 110. The height H1 can be between 1 micrometer and 50 micrometers. In some examples, the first semiconductor region 106 can have a thickness between 0.1 micrometer and 100 micrometers.

The first example semiconductor device 100 can include at least one first device terminal 116 positioned over the base surface 108 of the first semiconductor region 106. In the example show in FIG. 1, the at least one first device terminal 116 is a cathode terminal positioned spaced apart from the second semiconductor region 110 over the base surface 108. The cathode can be in ohmic contact with the first semiconductor region 106, and can include metals such as, for example, titanium, aluminum, nickel, gold, and other suitable conducting materials.

The first example semiconductor device 100 also can include at least one second device terminal 118 positioned over the top surface 114 of the second semiconductor region 110. In the example shown in FIG. 1, the at least one second device terminal 118 is an anode terminal. The at least one second device terminal 118 can make a Schottky contact with the second semiconductor region 110 and can include materials such as, for example, titanium, aluminum, nickel, gold, and other suitable conducting materials.

The first example semiconductor device 100 further includes a third semiconductor region 120 disposed over at least one sidewall 122 of the second semiconductor region 110. The third semiconductor region 120 can be of a second conductivity type, where the second conductivity type is the other of the n-type conductivity and p-type conductivity. For example, if the second semiconductor region 110 is of a n-type (p-type) conductivity, then the third semiconductor region 120 can be of the p-type (n-type) conductivity. The at least one sidewall 122 of the second semiconductor region 110 can extend over the height H1 of the second semiconductor region 110. In some examples, the third semiconductor region 120 can cover the entire height (H1) of at least one sidewall 122 of the second semiconductor region 110. In some examples, the third semiconductor region 120 can cover at least half a height (H1) of the at least one sidewall 122 of the second semiconductor region 110. The third semiconductor region 120 and the second semiconductor region 110 can form a RESURF structure at the at least one sidewall 122. In some examples, the third semiconductor region 120 can be disposed over more than half the surface area of the at least one sidewall 122 of the second semiconductor region 110. While the at least one sidewall 122 shown in FIG. 1 are substantially vertical with respect to the base surface 108, in some implementations, due to process artifacts, the at least one sidewall 122 may have a non-perpendicular angular relationship with the base surface 108. In some such instances, the third semiconductor region 120 may be disposed over the entire sloping height of the at least one sidewall 122, or at least half the sloping height of the at least one sidewall 122, or at least half the surface area of the at least one sidewall 122. The RESURF structure formed by the third semiconductor region 120 and the second semiconductor region 110 can help mitigate formation of electric field peaks and can therefore improve the BV of the first example semiconductor device 100. In some examples, a bandgap of the third semiconductor region 120 can be greater than or equal to a bandgap of the second semiconductor region 110.

The third semiconductor region 120 is disposed over at least a portion of the at least one second device terminal 118. For example, referring to FIG. 1, a portion 124 of the third semiconductor region 120 is disposed over a top surface 126 of the at least one second device terminal 118. In some instances, the third semiconductor region 120 may cover only a fraction of the total surface area of the top surface 126 of the at least one second device terminal 118. In some instances, the third semiconductor region 120 may not cover any portion of the at least one second device terminal 118 and may instead be only covering the sides of the at least one second device terminal 118. In some examples, during fabrication, the at least one second device terminal 118 can be utilized as a mask for forming the underlying mesa constituted by the second semiconductor region 110. As a result, the edges of the at least one second device terminal 118 can be aligned with the edges of the second semiconductor region 110. This alignment of the edges of the at least one second device terminal 118 and the second semiconductor region 110 can help reduce electric field crowding.

In some examples, the second semiconductor region 110 and the third semiconductor region 120 can be formed of different materials. For example, the second semiconductor region 110 can be formed of GaN, while the third semiconductor region 120 can be formed of NiO. In some other examples, the second semiconductor region 110 and the third semiconductor region 120 can be formed of the same materials.

The first example semiconductor device 100 can be viewed as a quasi-vertical device because of the current path between the at least one first device terminal 116 and the at least one second device terminal 118. That is, at least a portion of the current path flows vertically through the drift region defined by the second semiconductor region 110 and at least the portion of the current flows laterally through the first semiconductor region 106.

Figure 2:
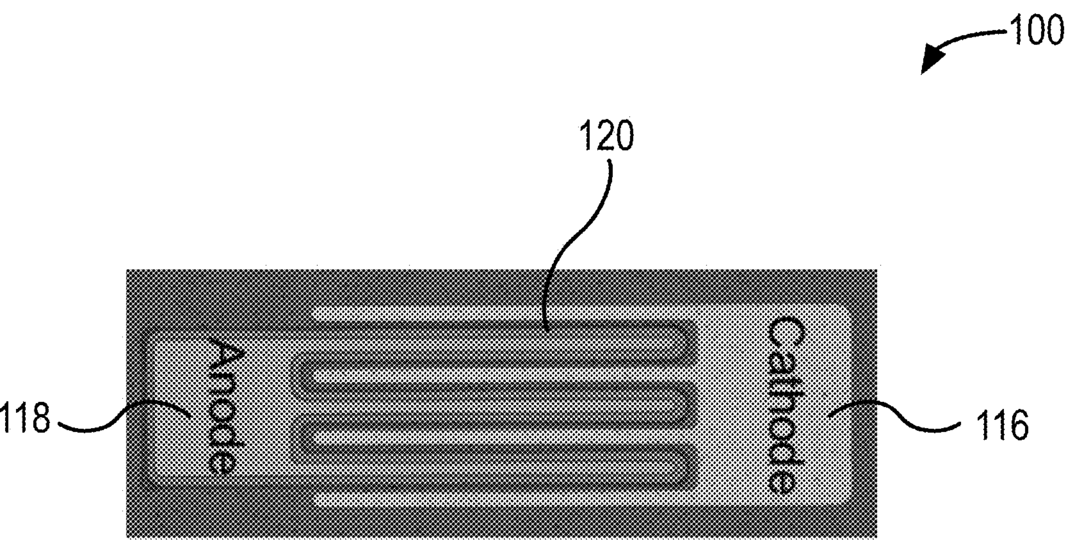
FIG. 2 shows the at least one second device terminal and the at least one first device terminal having a comb structure, where the segments of the comb structures of the at least one second device terminal and the at least one first device terminal are interspaced.

FIG. 2 shows a top view of the first example semiconductor device 100 discussed above in relation to FIG. 1. FIG. 2 shows the at least one second device terminal 118 and the at least one first device terminal 116 having a comb structure, where the segments of the comb structures of the at least one second device terminal 118 and the at least one first device terminal 116 are interspaced. This allows increase in surface area between the two terminals and increased current carrying capacity.

Figure 3:
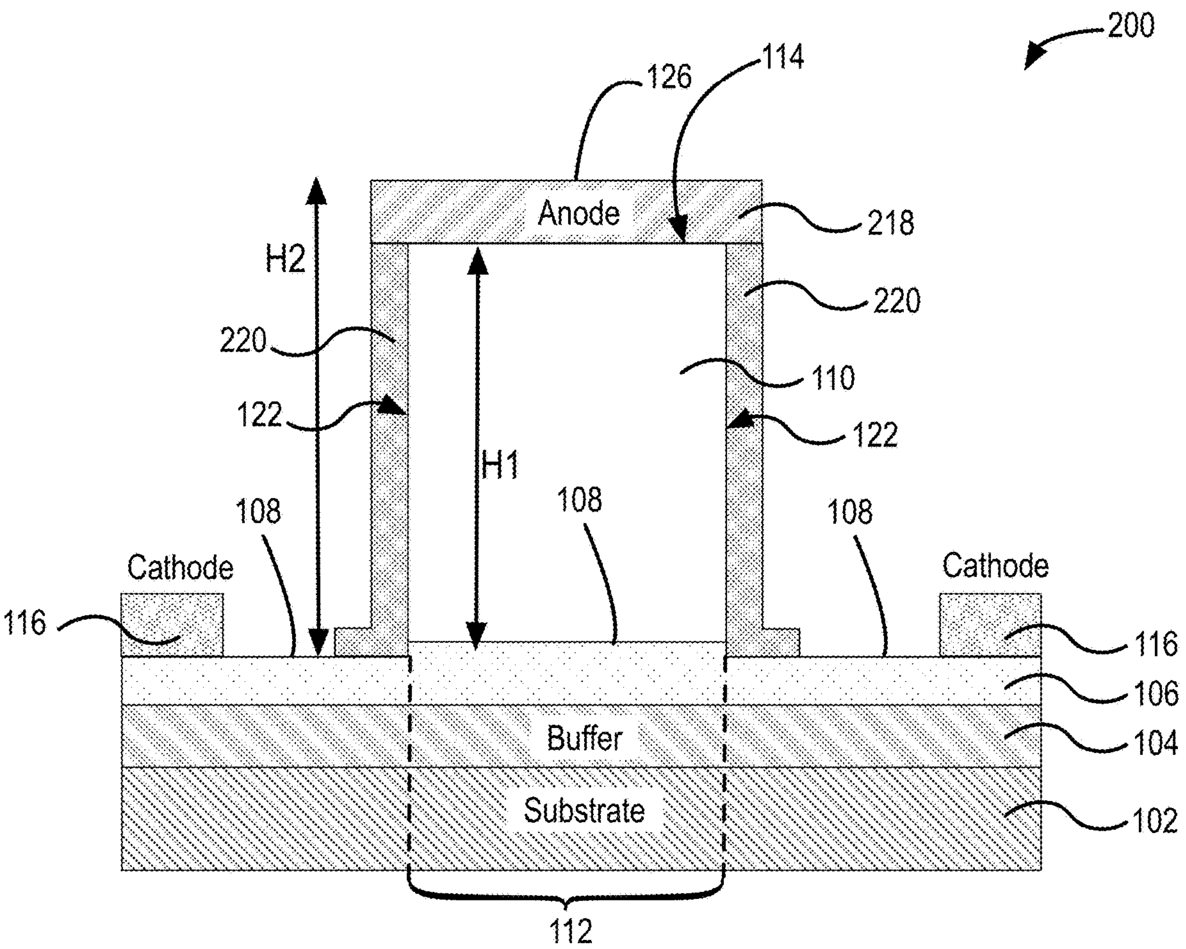
FIG. 3 shows a second example semiconductor device, which includes at least one second device terminal that covers a third semiconductor region.

FIG. 3 shows a second example semiconductor device 200, which includes at least one second device terminal 218 that covers a third semiconductor region 220. In many respects, the second example semiconductor device 200 shown in FIG. 3 is similar to the first example semiconductor device 100 shown in FIG. 1, in that the second example semiconductor device 200 is also a Schottky diode. To the extent that the two devices include the same elements, such elements are referenced with the same numerals. The second example semiconductor device 200 includes a third semiconductor region 220 that is similar to the third semiconductor region 120 discussed above in relation to FIG. 1, except that the third semiconductor region 220 in the second example semiconductor device 200 does not cover any portion of the at least one second device terminal 218. Instead, the at least one second device terminal 218 is sized such that the at least one second device terminal 218 covers both the top surface 114 of the second semiconductor region 110 and the third semiconductor region 220. In the example show in FIG. 3, the third semiconductor region 220 extends between the base surface 108 of the first semiconductor region 106 and the bottom surface of the at least one second device terminal 218. In some other examples, such as those discussed above in relation to the third semiconductor region 120 of the first example semiconductor device 100, the third semiconductor region 220 may not extend fully to the at least one second device terminal 218. For example, as mentioned above in relation to the third semiconductor region 120 of the first example semiconductor device 100, the third semiconductor region 220 may be disposed over at least half the height H1 of the at least one sidewall 122 of the second semiconductor region 110, or be disposed over at least half the surface area of the at least one sidewall 122 of the second semiconductor region 110. The structure formed by the third semiconductor region 220 and the second semiconductor region 110 at the at least one sidewall 122 can help reduce peak electric fields in the device, thereby improving the BV of the device.

Figure 4:
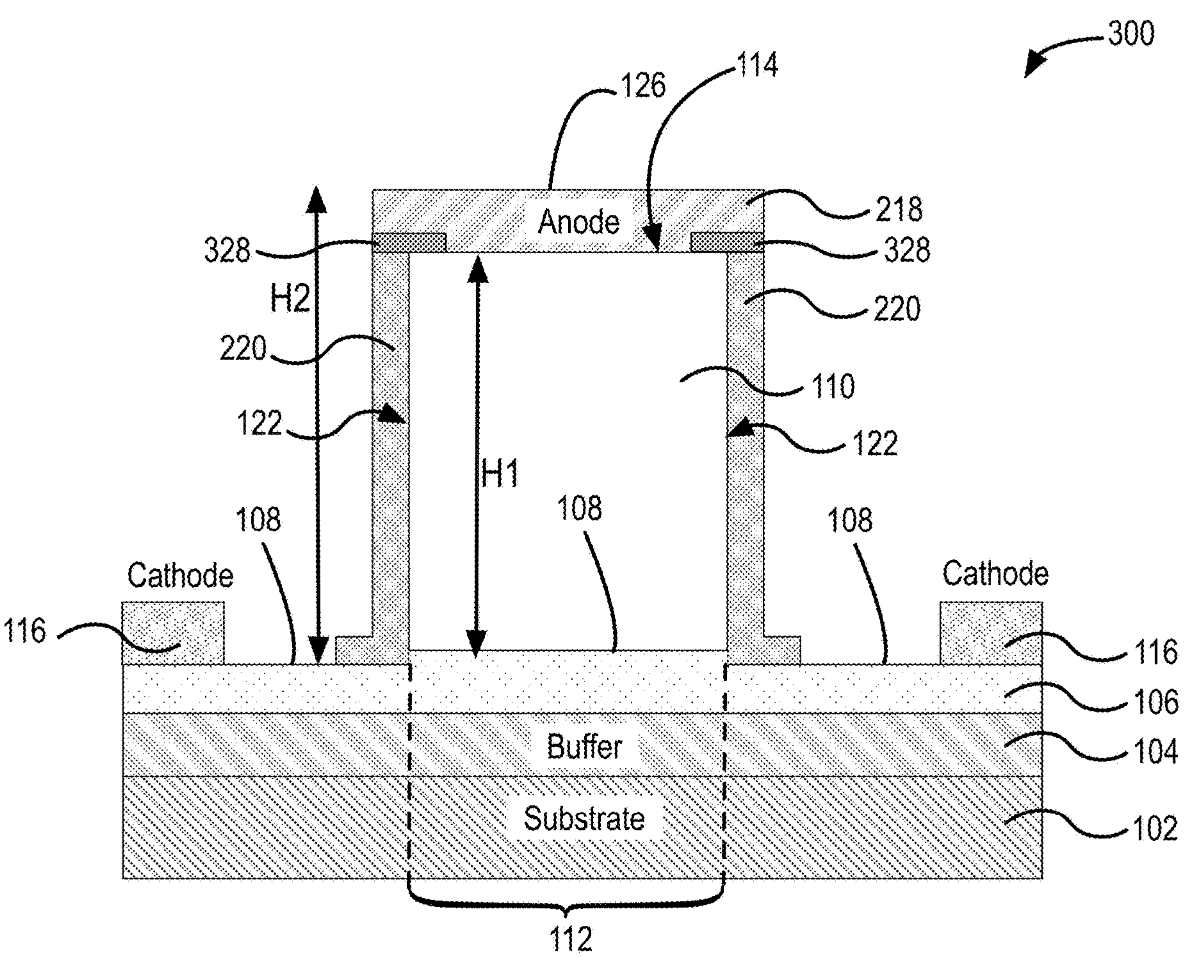
FIG. 4 shows a third example semiconductor device in which a dielectric region is disposed over at least a portion of the second semiconductor region and at least a portion of the third semiconductor region.

FIG. 4 shows a third example semiconductor device 300 in which a dielectric region 328 is disposed over at least a portion of the second semiconductor region 110 and at least a portion of the third semiconductor region 220. The third example semiconductor device 300 shown in FIG. 4 is similar to the second example semiconductor device 200 discussed above in relation to FIG. 3, in that like the second example semiconductor device 200, the third example semiconductor device 300 is also a Schottky diode. To the extent that that the second example semiconductor device 200 and the third example semiconductor device 300 have common elements, such elements are referred to with the same reference numerals. As mentioned above, the third example semiconductor device 300 includes a dielectric region 328 that is positioned between the at least one second device terminal 218 and both the second semiconductor region 110 and the third semiconductor region 220. In particular, the dielectric region 328 covers the interface between the third semiconductor region 220 and the second semiconductor region 110. In the example shown in FIG. 4, top surfaces of the second semiconductor region 110 and the third semiconductor region 220 are substantially coplanar, and the dielectric region 328 is disposed over portions of top surfaces of both the second semiconductor region 110 and the third semiconductor region 220. In some examples, the dielectric region 328 can cover the entire top surface of the third semiconductor region 220 but cover only a portion of the top surface 114 of the second semiconductor region 110. In some examples, the dielectric region 328 can cover only a portion of the top surface of the third semiconductor region 220, the other portion of which can make contact with the at least one second device terminal 218. The inclusion of the dielectric region 328 can further help reduce electric field crowding.

Figure 5:
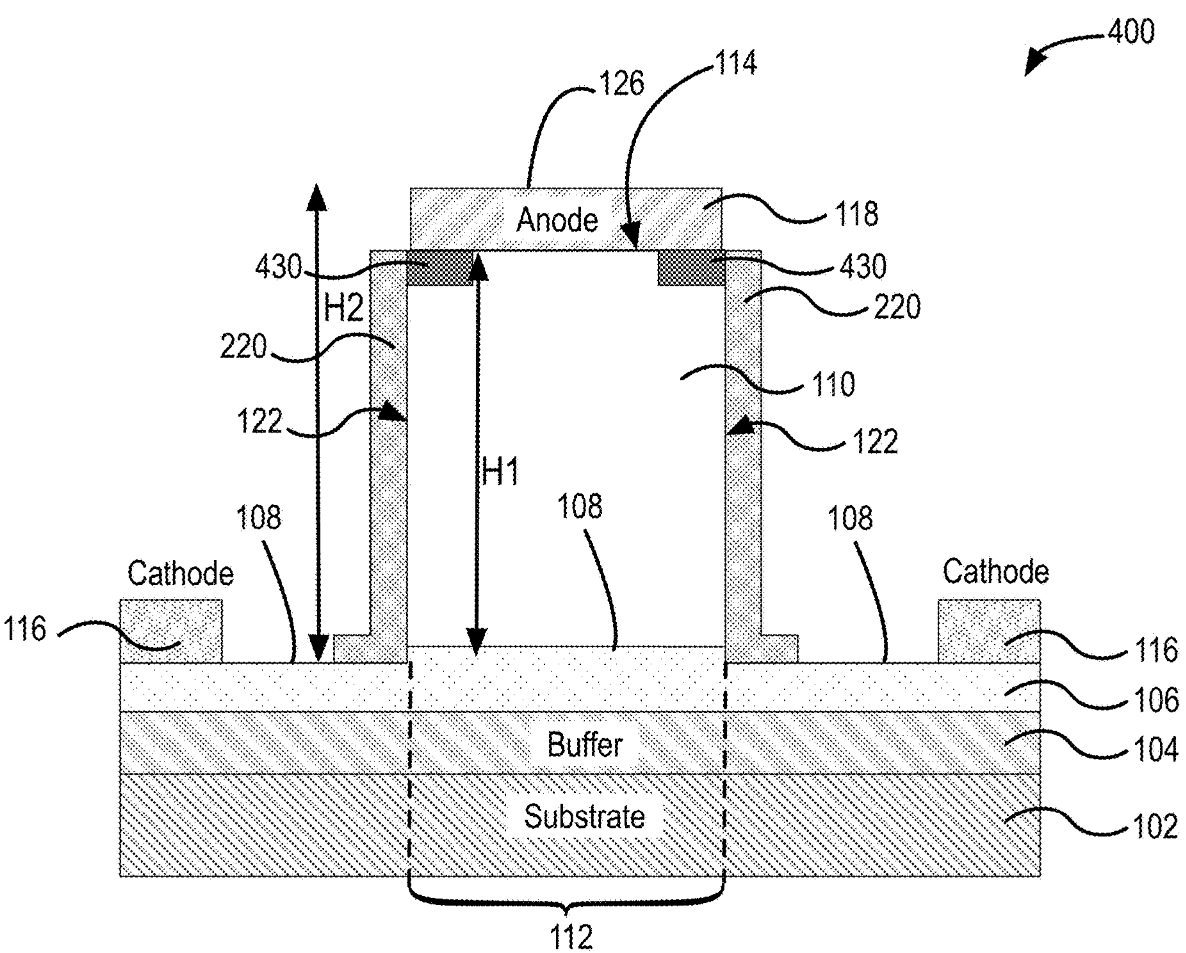
FIG. 5 shows a fourth example semiconductor device that includes at least one ion implantation region.

FIG. 5 shows a fourth example semiconductor device 400 that includes at least one ion implantation region 430. The fourth example semiconductor device 400 shown in FIG. 5 is similar to the second example semiconductor device 200 and the third example semiconductor device 300 discussed above in relation to FIGS. 3 and 4, in that the like the second example semiconductor device 200 and the third example semiconductor device 300, the fourth example semiconductor device 400 is a Schottky diode. To the extent that that the fourth example semiconductor device 400 and the third example semiconductor device 300 and the second example semiconductor device 200 have common elements, such elements are referred to with the same reference numerals. The fourth example semiconductor device 400 can include at least one ion implantation region 430 that is in contact with both the at least one second device terminal 118 and the third semiconductor region 220. The at least one ion implantation region 430 can be formed in the second semiconductor region 110 near the top surface 114 of the second semiconductor region 110. In particular, the at least one ion implantation region 430 can be formed such that at least a portion of the at least one sidewall 122 includes the at least one ion implantation region 430 and at least a portion of the top surface 114 of the second semiconductor region 110 includes the at least one ion implantation region 430. Along the at least one sidewall 122 the at least one ion implantation region 430 makes contact with at least a portion of the third semiconductor region 220, while over the top surface 114 of the second semiconductor region 110, the at least one ion implantation region 430 makes contact with at least a portion of the at least one second device terminal 118.

In the example shown in FIG. 5, the at least one second device terminal 118 extends over the top surface 114 of the second semiconductor region 110 covering at least a portion of the at least one ion implantation region 430. In some instances, the at least one second device terminal 118 can extend beyond the at least one sidewall 122 and cover and make contact with at least a portion of a top surface of the third semiconductor region 220. The at least one ion implantation region 430 can be formed of the same material as the second semiconductor region 110. For instance, if the second semiconductor region 110 is made of GaN, then the at least one ion implantation region 430 can be formed by ion implantation of the second semiconductor region 110 near the top surface 114 of the second semiconductor region 110, where ions used for ion implantation can include, for example, Mg, N, Ar, F, and the like. The at least one ion implantation region 430 can increase the resistivity of the second semiconductor region 110 and reduce the carrier charge density of the second semiconductor region 110 at the location of the edge of the at least one second device terminal 118 and the second semiconductor region 110. In some examples, the at least one ion implantation region 430 can have a conductivity type that is the same as the conductivity type of the second semiconductor region 110. In some other examples, the conductivity type of the at least one ion implantation region 430 can be different from the conductivity type of the second semiconductor region 110. For example, if the conductivity type of the second semiconductor region 110 is n-type (p-type), then the conductivity type of the at least one ion implantation region 430 can be p-type (n-type). The reduction in the resistance and the carrier charge density can help reduce electric field crowding, and thereby improve the BV of the device.

Figure 6:
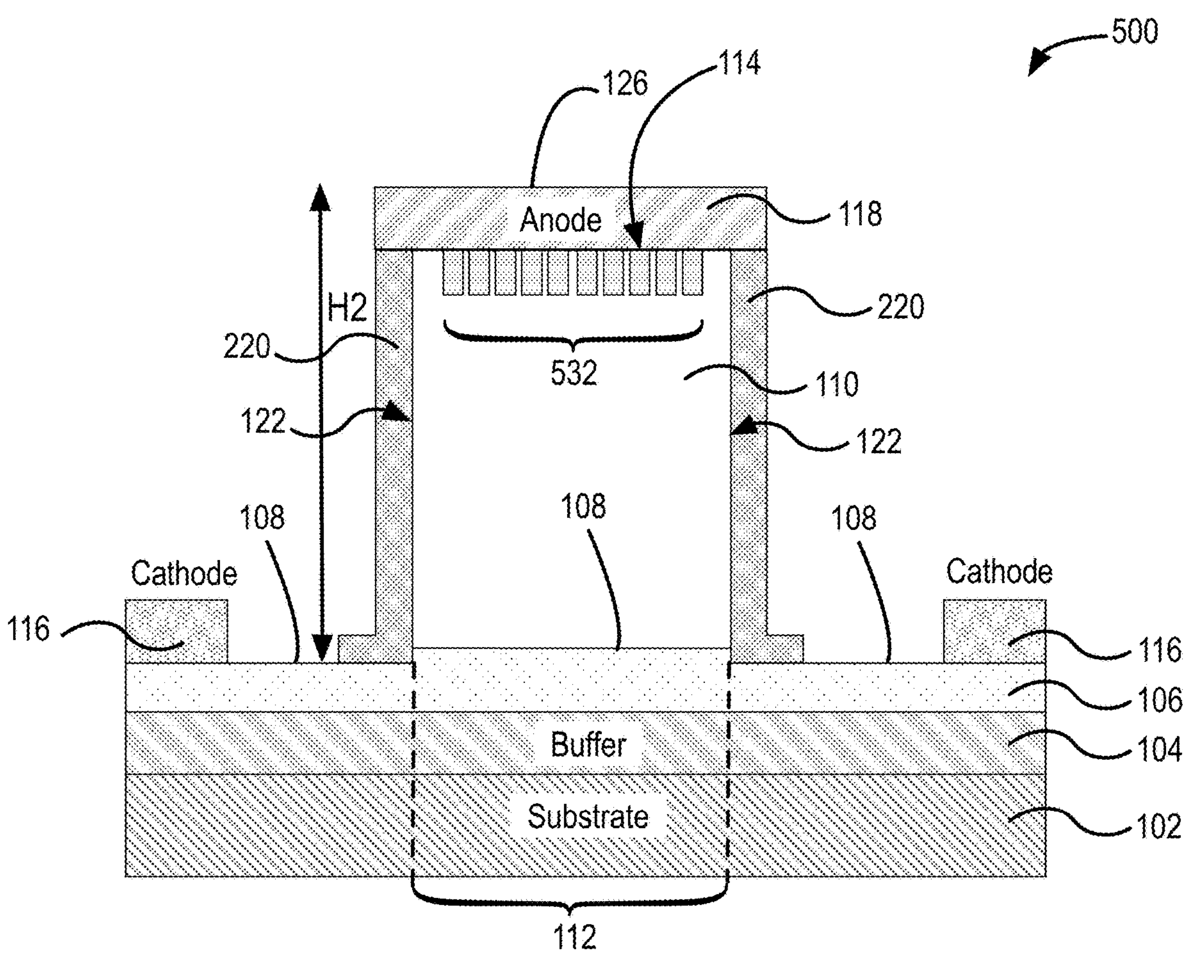
FIG. 6 depicts a fifth example semiconductor device such as, for example, a junction barrier Schottky diode.

FIG. 6 depicts a fifth example semiconductor device 500. In particular, the fifth example semiconductor device 500 can be a junction barrier controlled Schottky (JBS) diode. The fifth example semiconductor device 500 includes a comb structure 532 positioned in the second semiconductor region 110 below the at least one second device terminal 118. For example, the comb structure 532 can be positioned such that it makes contact with the at least one second device terminal 118 at the top surface 114 of the second semiconductor region 110. The inclusion of the third semiconductor region 220 over the at least one sidewall 122 of the second semiconductor region 110 helps reducing electric field crowding in the fifth example semiconductor device 500, thereby improving the BV of the fifth example semiconductor device 500. The comb structure 532 can include material having a second conductivity type, in contrast with the second semiconductor region 110, which can be of the first conductivity type. For example, if the second semiconductor region 110 is of n-type (p-type) conductivity then the comb structure 532 can be of the p-type (n-type) conductivity. In some examples, the bandgap of the comb structure 532 can be greater than or equal to the bandgap of the second semiconductor region 110.

Figure 7:
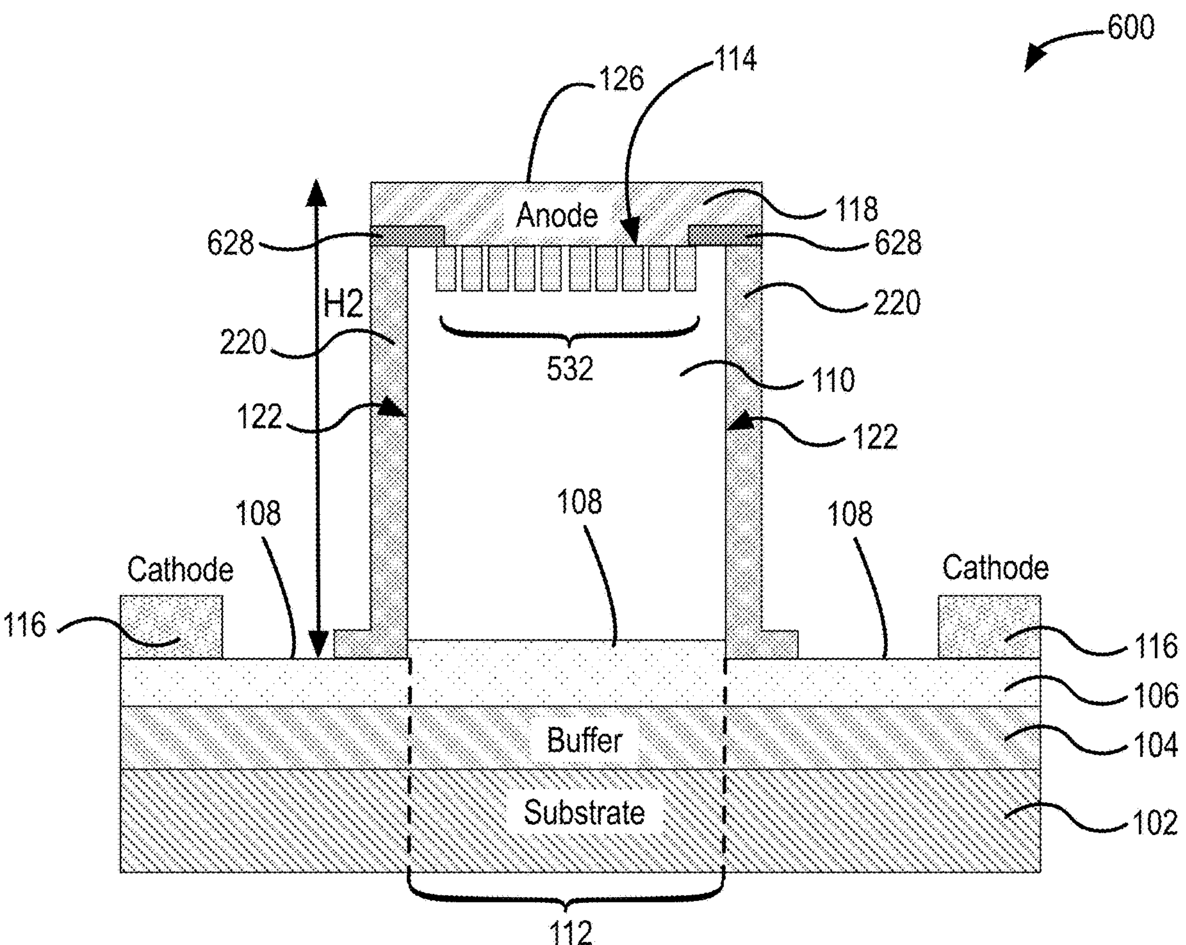
FIG. 7 depicts a sixth example semiconductor device such as, for example, a junction barrier Schottky diode in which a dielectric region is disposed over at least a portion of the second semiconductor region and at least a portion of the third semiconductor region.

FIG. 7 depicts a sixth example semiconductor device 600. In particular, the sixth example semiconductor device 600 is a JBS, which is similar to the fifth example semiconductor device 500 discussed above in relation to FIG. 6. The sixth example semiconductor device 600 additionally includes a dielectric region 628 disposed over at least a portion of the second semiconductor region 110 and at least a portion of the third semiconductor region 220. The dielectric region 628 shown in FIG. 6 can be similar to the dielectric region 328 discussed above in relation to the third example semiconductor device 300 shown in FIG. 4. The at least one second device terminal 118 is positioned over at least a portion of the dielectric region 628. In the example shown in FIG. 7, at least a portion of the dielectric region 628 is positioned over the comb structure 532.

Figure 8:
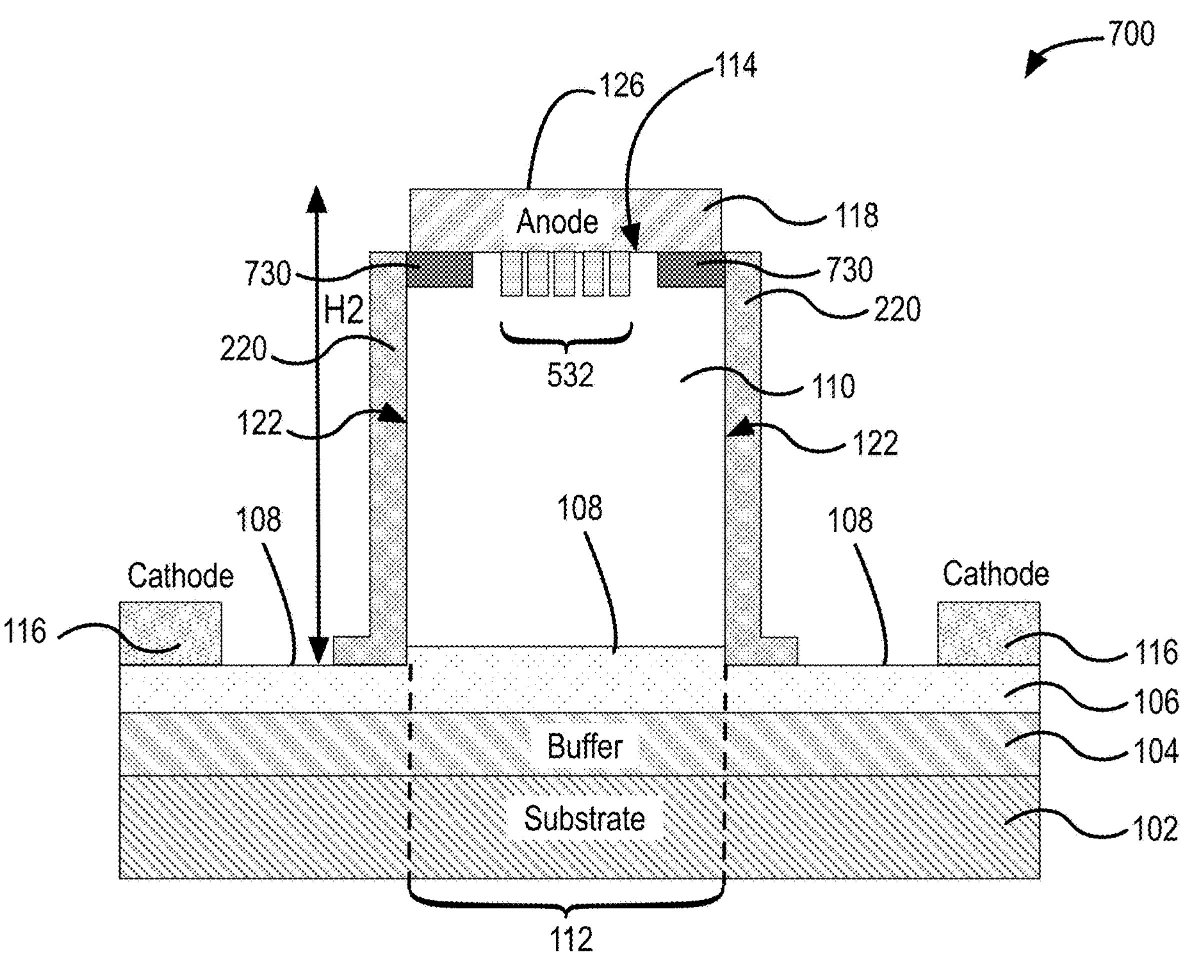
FIG. 8 shows a seventh example semiconductor device such as, for example a junction barrier Schottky diode which includes at least one ion implantation region.

FIG. 8 shows a seventh example semiconductor device 700. In particular, the seventh example semiconductor device 700 is a JBS, which is similar to the fifth example semiconductor device 500 discussed above in relation to FIG. 6. The seventh example semiconductor device 700 additionally includes at least one ion implantation region 730 in the second semiconductor region 110, where the at least one ion implantation region 730 is in contact with both the at least one second device terminal 118 and the third semiconductor region 220. While FIG. 8 shows that the at least one second device terminal 118 extends only up to the at least one sidewall 122 over the top surface 114 of the second semiconductor region 110, in some instances, the at least one second device terminal 118 can extend further and cover and make contact with at least a portion of a top surface of the third semiconductor region 220. The at least one ion implantation region 730 forms at least a portion of the top surface 114 of the second semiconductor region 110 and is spaced apart from the comb structure 532. The at least one ion implantation region 730 can be similar to the at least one ion implantation region 430 of the fourth example semiconductor device 400 discussed above in relation to FIG. 5. The at least one ion implantation region 730 can increase the resistivity of the second semiconductor region 110 and reduce the carrier charge density of the second semiconductor region 110 at the location of the edge of the at least one second device terminal 118 and the second semiconductor region 110. The reduction in the resistance and the carrier charge density can help reduce electric field crowding, and thereby improve the BV of the device.

Figure 9:
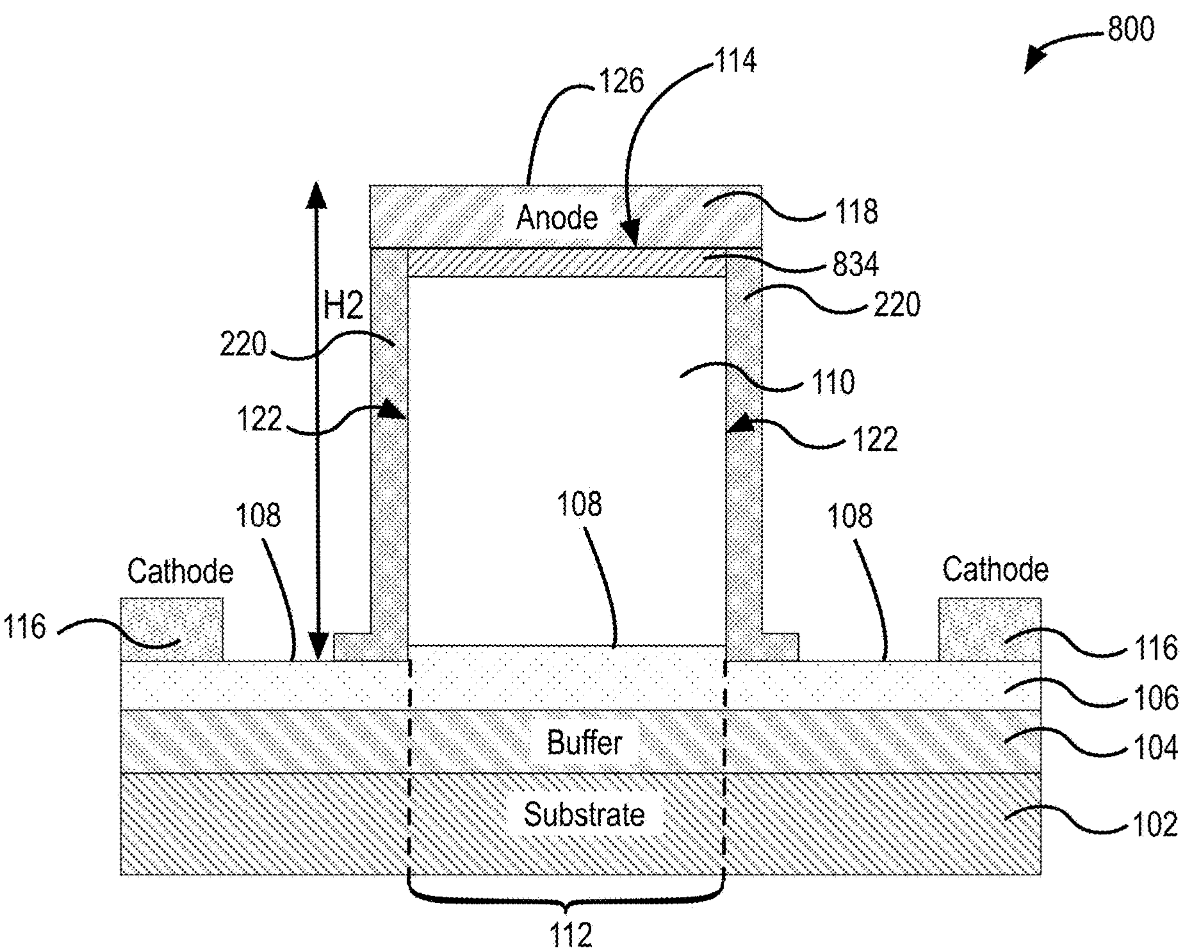
FIG. 9 shows an eighth example semiconductor device that can be characterized as a PN diode.

FIG. 9 shows an eighth example semiconductor device 800 that can be characterized as a PN diode. The eighth example semiconductor device 800 can be similar in many respects to the second example semiconductor device 200 discussed above in relation to FIG. 3, and like elements have been referred to with like reference numerals. Unlike the second example semiconductor device 200, which is a Schottky diode, the eighth example semiconductor device 800 is a PN diode. The eighth example semiconductor device 800 includes a fourth semiconductor region 834 positioned between the second semiconductor region 110 and the at least one second device terminal 118. The fourth semiconductor region 834 can have a conductivity type that is different from the conductivity type of the second semiconductor region 110. For example, if the second semiconductor region 110 is of the n-type (p-type) conductivity, then the fourth semiconductor region 834 can be of the p-type (n-type) conductivity. As discussed above, the presence of the third semiconductor region 220 over the at least one sidewall 122 of the second semiconductor region 110 can reduce crowding of electrical fields within the device, and thereby improve the BV of the device.

Figure 10:
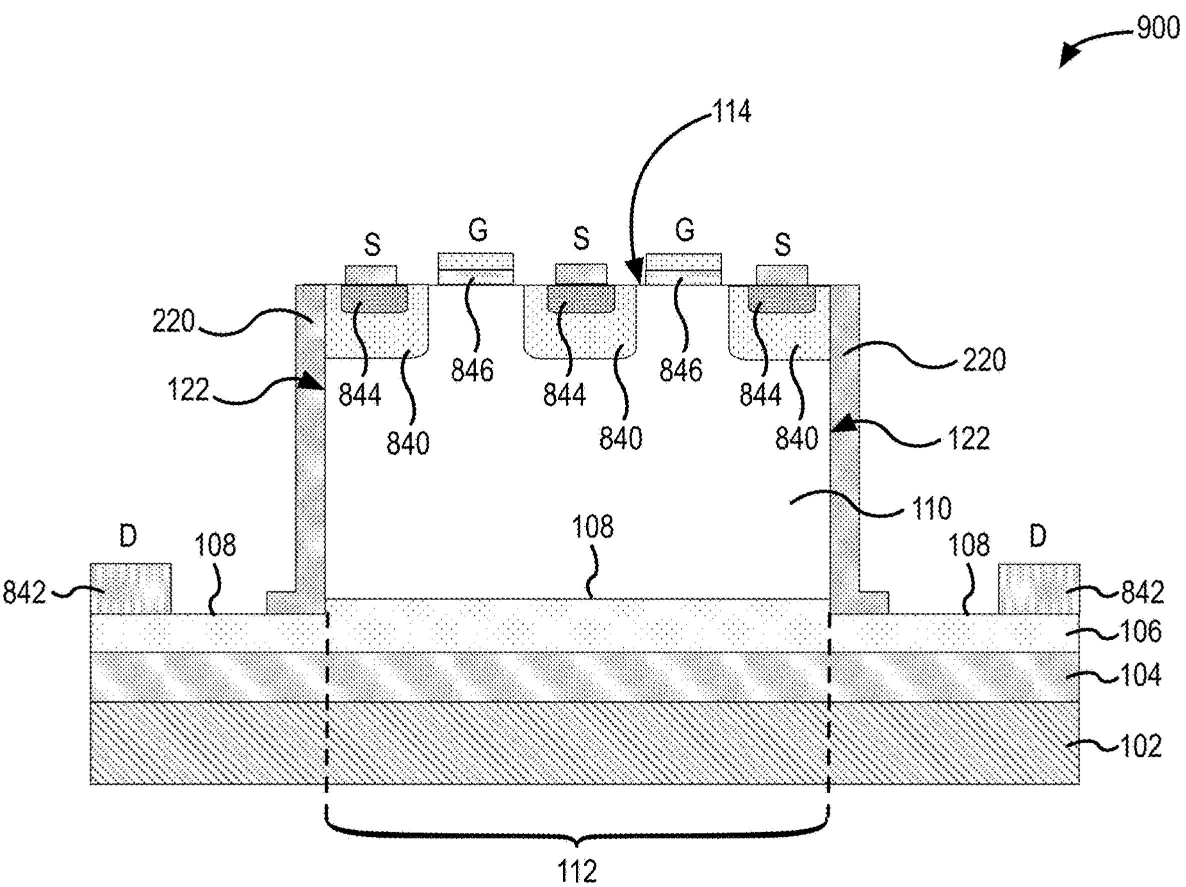
FIG. 10 shows a ninth example semiconductor device 900 that can be characterized as a metal oxide semiconductor field effect transistor (MOSFET).

FIG. 10 shows a ninth example semiconductor device 900 that can be characterized as a metal oxide semiconductor field effect transistor (MOSFET). The ninth example semiconductor device 900, similar to the other devices discussed herein, includes the substrate 102, the buffer region 104 positioned over the substrate, and the first semiconductor region 106 positioned over the buffer region 104. The ninth example semiconductor device 900 further includes drain terminals (D) positioned over the base surface 108 of the first semiconductor region 106. The source(S) and gate (G) terminals of the ninth example semiconductor device 900 can be formed on the second semiconductor region 110. The third semiconductor region 220 is disposed over the at least one sidewall 122 of the second semiconductor region 110 in a manner similar to that discussed herein in relation to other devices. Gate terminals (G) are positioned over the second semiconductor region 110 where dielectric material 846 is positioned between the gate terminals (G) and the top surface 114 of the second semiconductor region 110. Source terminals(S) are also positioned over the top surface 114 of the second semiconductor region 110 and are interspaced alternately with the gate terminals (G). Highly doped regions of the first conductivity type 844 (i.e., the same conductivity type as the second semiconductor region 110) are positioned in the second semiconductor region 110 and below the source terminals(S). The highly doped regions 844 are formed within doped regions 840 of the second conductivity type (i.e., the same conductivity type as the third semiconductor region 220). At least some of the doped regions 840, in particular the ones positioned along the at least one sidewall 122 of the second semiconductor region 110, can make contact with the third semiconductor region 220.

Figure 11:
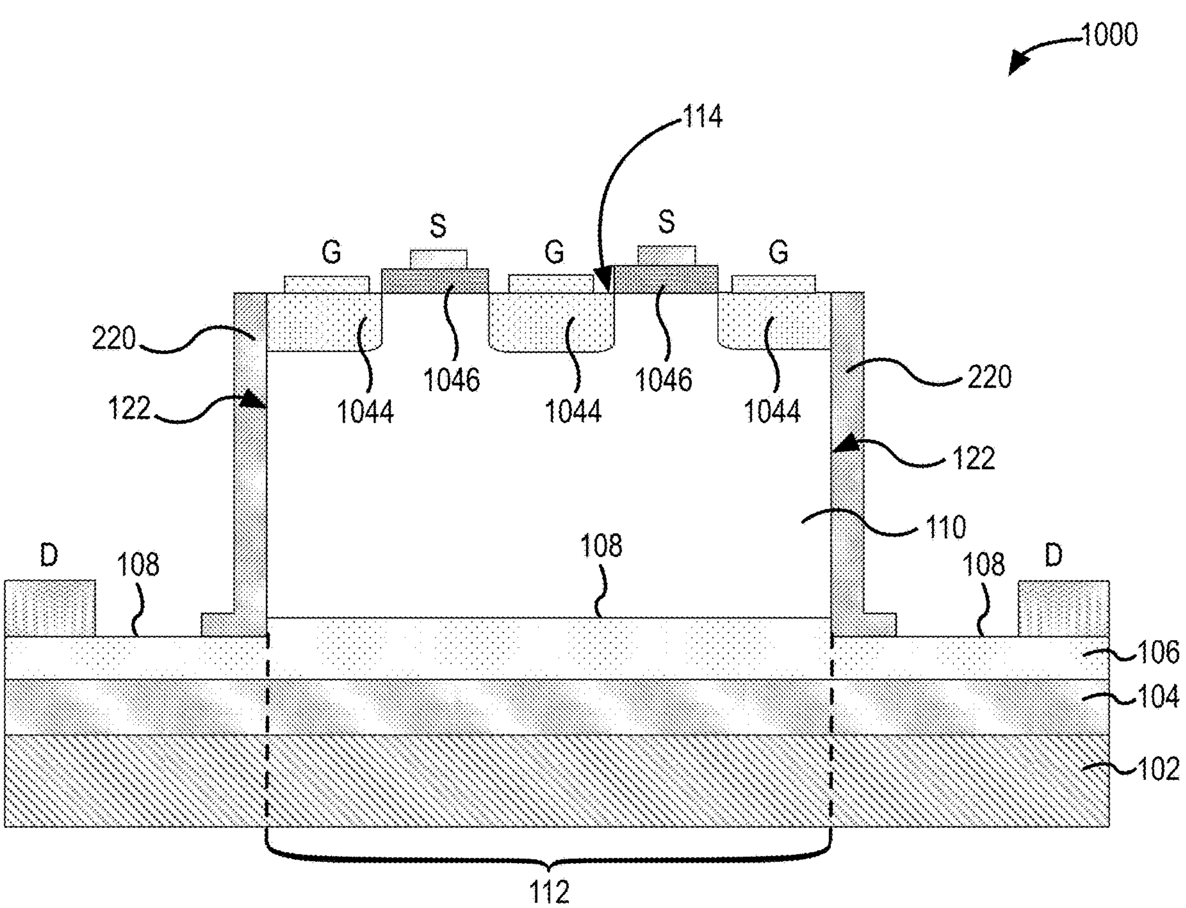
FIG. 11 shows a tenth example semiconductor device 1000 that can be characterized as a junction field effect transistor (JFET).

FIG. 11 shows a tenth example semiconductor device 1000 that can be characterized as a junction field effect transistor (JFET). The tenth example semiconductor device 1000 can be similar in many respects to the ninth example semiconductor device 900 discussed above in relation to FIG. 10. To that extent, like elements have been referenced with like reference numerals. The tenth example semiconductor device 1000 includes gate terminals (G) positioned on the top surface 114 of the second semiconductor region 110. The gate terminals (G) are formed over gate doped regions 1044 of the second conductivity type. That is, the type of conductivity of the gate doped regions 1044 can be the same as the conductivity type of the third semiconductor region 220. Source terminals(S) are disposed over the top surface 114 of the second semiconductor region 110 with highly doped regions 1046 positioned between the source terminals(S) and the top surface 114 of the second semiconductor region 110. The gate terminals (G) and the source terminals(S) are positioned alternately over the top surface 114 of the second semiconductor region 110. The drain terminals (D) are positioned over the base surface 108 of the first semiconductor region 106 and are spaced apart from the third semiconductor region 220.

In both the ninth example semiconductor device 900 and the tenth example semiconductor device 1000 discussed above in relation to FIGS. 10 and 11, the inclusion of the third semiconductor region 220 over the at least one sidewall 122 of the second semiconductor region 110 can help reduce electric field crowding, thereby improving the BV of the MOSFET and the JFET.

In one or more of the example devices discussed herein, the doping concentration Nt of the third semiconductor region (120, 220) can be greater than the doping concentration Ns of the second semiconductor region 110. In some examples, the doping concentration Nt of the third semiconductor region (120, 220) can be more than five times the doping concentration Ns of the second semiconductor region 110 (i.e., Nt>5Ns). The third semiconductor device can have a width Wt described as the thickness of the third semiconductor region over the at least one sidewall 122 measured in a dimension normal to the at least one sidewall 122. The second semiconductor region 110 can have a width Ws that can be measured as the distance between opposing sidewalls 122. In some examples, a product of the doping concentration Nt and the width Wt of the third semiconductor region (120, 220) can be less than half the product of the doping concentration Ns and the width Ws of the second semiconductor region 110 (i.e., Nt×Wt<0.5 Ns×Ws).

References: All cited references, patent or literature, are incorporated by reference in their entirety. The examples disclosed herein are illustrative and not limiting in nature. Details disclosed with respect to the methods described herein included in one example or embodiment may be applied to other examples and embodiments. Any aspect of the present disclosure that has been described herein may be disclaimed, i.e., exclude from the claimed subject matter whether by proviso or otherwise.

[1] Y. Zhang, F. Udrea, and H. Wang, "Multidimensional device architectures for efficient power electronics," Nat. Electron., vol. 5, no. 11, Art. no. 11, November 2022, doi: 10.1038/s41928-022-00860-5.

[2] K. J. Chen, O. Haberlen, A. Lidow, C. lin Tsai, T. Ueda, Y. Uemoto, and Y. Wu, "GaN-on-Si Power Technology: Devices and Applications," IEEE Trans. Electron Devices, vol. 64, no. 3, pp. 779-795, March 2017, doi: 10.1109/TED.2017.2657579.

[3] M. Xiao, Y. Ma, K. Liu, K. Cheng, and Y. Zhang, "10 kV, 39 mΩ·cm2 Multi-Channel AlGaN/GaN Schottky Barrier Diodes," IEEE Electron Device Lett., vol. 42, no. 6, pp. 808-811, June 2021, doi: 10.1109/LED.2021.3076802.

[4] M. Xiao, Y. Ma, Z. Du, V. Pathirana, K. Cheng, A. Xie, E. Beam, Y. Cao, F. Udrea, H. Wang, and Y. Zhang, "Multi-Channel Monolithic-Cascode HEMT (MC2-HEMT): A New GaN Power Switch up to 10 kV," in 2021 IEEE International Electron Devices Meeting (IEDM), December 2021, p. 5.5.1-5.5.4. doi: 10.1109/IEDM19574.2021.9720714.

[5] Y. Zhang and T. Palacios, "(Ultra) Wide-Bandgap Vertical Power FinFETs," IEEE Trans. Electron Devices, vol. 67, no. 10, pp. 3960-3971 October 2020, doi: 10.1109/TED.2020.3002880.

[6] J. Liu, R. Zhang, M. Xiao, S. Pidaparthi, H. Cui, A. Edwards, L. Baubutr, C. Drowley, and Y. Zhang, "Surge Current and Avalanche Ruggedness of 1.2-kV Vertical GaN p-n Diodes," IEEE Trans. Power Electron., vol. 36, no. 10, pp. 10959-10964, October 2021, doi: 10.1109/TPEL.2021.3067019.

[7] T. Oka, "Recent development of vertical GaN power devices," Jpn. J. Appl. Phys., vol. 58, no. S B, p. SB0805, April 2019, doi: 10.7567/1347-4065/ab02e7.

[8] J. Liu, M. Xiao, R. Zhang, S. Pidaparthi, H. Cui, A. Edwards, M. Craven, L. Baubutr, C. Drowley, and Y. Zhang, "1.2-kV Vertical GaN Fin-JFETs: High-Temperature Characteristics and Avalanche Capability," IEEE Trans. Electron Devices, vol. 68, no. 4, pp. 2025-232 April 2021, doi: 10.1109/TED.2021.3059192.

[9] Y. Zhang, A. Dadgar, and T. Palacios, "Gallium nitride vertical power devices on foreign substrates: a review and outlook," J. Phys. Appl. Phys., vol. 51, no. 27, p. 273001, 2018, doi: 10.1088/1361-6463/aac8aa.

[10] Y. Zhang, M. Sun, D. Piedra, M. Azize, X. Zhang, T. Fujishima, and T. Palacios, "GaN-on-Si Vertical Schottky and p-n Diodes," IEEE Electron Device Lett., vol. 35, no. 6, pp. 618-620, June 2014, doi: 10.1109/LED.2014.2314637.

[11] Y. Zhang, D. Piedra, M. Sun, J. Hennig, A. Dadgar, L. Yu, and T. Palacios, "High-Performance 500 V Quasi- and Fully-Vertical GaN-on-Si pn Diodes," IEEE Electron Device Lett., vol. 38, no. 2, pp. 248-251, February 2017, doi: 10.1109/LED.2016.2646669.

[12] X. Zhang, X. Zou, X. Lu, C. W. Tang, and K. M. Lau, "Fully- and Quasi-Vertical GaN-on-Si p-i-n Diodes: High Performance and Comprehensive Comparison," IEEE Trans. Electron Devices, vol. 64, no. 3, pp. 809-815, March 2017, doi: 10.1109/TED.2017.2647990.

[13] R. Abdul Khadar, C. Liu, L. Zhang, P. Xiang, K. Cheng, and E. Matioli, "820-V GaN-on-Si Quasi-Vertical p-i-n Diodes With BFOM of 2.0 G W/cm2," IEEE Electron Device Lett., vol. 39, no. 3, pp. 401-404, March 2018, doi: 10.1109/LED.2018.2793669.

[14] Y. Li, M. Wang, R. Yin, J. Zhang, M. Tao, B. Xie, Y. Hao, X. Yang, C. P. Wen, and B. Shen, "Quasi-Vertical GaN Schottky Barrier Diode on Silicon Substrate With 1010 High On/Off Current Ratio and Low Specific On-Resistance," IEEE Electron Device Lett., vol. 41, no. 3, pp. 329-332, March 2020, doi: 10.1109/LED.2020.2968392.

[15] X. Guo, Y. Zhong, J. He, Y. Zhou, S. Su, X. Chen, J. Liu, H. Gao, X. Sun, Q. Zhou, Q. Sun, and H. Yang, "High-Voltage and High-ION/IOFF Quasi-Vertical GaN-on-Si Schottky Barrier Diode With Argon-Implanted Termination," IEEE Electron Device Lett., vol. 42, no. 4, pp. 473-476, April 2021, doi: 10.1109/LED.2021.3058380.

[16] X. Guo, Y. Zhong, Y. Zhou, S. Su, X. Chen, S. Yan, J. Liu, X. Sun, Q. Sun, and H. Yang, "Nitrogen-Implanted Guard Rings for 600-V Quasi-Vertical GaN-on-Si Schottky Barrier Diodes With a BFOM of 0.26 G W/cm2," IEEE Trans. Electron Devices, vol. 68, no. 11, pp. 5682-5686 November 2021, doi: 10.1109/TED.2021.3108951.

[17] R. M. A. Khadar, A. Floriduz, T. Wang, and E. MATIOLI, "p-NiO junction termination extensions for GaN power devices," Appl. Phys. Express, June 2021, doi: 10.35848/1882-0786/ac09ff.

[18] X. Guo, Y. Zhong, Y. Zhou, X. Chen, S. Yan, J. Liu, X. Sun, Q. Sun, and H. Yang, "1200-V GaN-on-Si Quasi-Vertical p-n Diodes," IEEE Electron Device Lett., vol. 43, no. 12, pp. 2057-260 December 2022, doi: 10.1109/LED.2022.3219103.

[19] X. Zou, X. Zhang, X. Lu, C. W. Tang, and K. M. Lau, "Fully Vertical GaN p-i-n Diodes Using GaN-on-Si Epilayers," IEEE Electron Device Lett., vol. 37, no. 5, pp. 636-639, May 2016, doi: 10.1109/LED.2016.2548488.

[20] S. Mase, Y. Urayama, T. Hamada, J. J. Freedsman, and T. Egawa, "Novel fully vertical GaN p-n diode on Si substrate grown by metalorganic chemical vapor deposition," Appl. Phys. Express, vol. 9, no. 11, p. 111005, November 2016, doi: 10.7567/APEX.9.111005.

[21] K. Zhang, S. Mase, K. Nakamura, T. Hamada, and T. Egawa, "Demonstration of fully vertical GaN-on-Si Schottky diode," Electron. Lett., vol. 53, no. 24, pp. 1610-1611 October 2017, doi: 10.1049/el.2017.3166.

[22] Y. Zhang, M. Yuan, N. Chowdhury, K. Cheng, and T. Palacios, "720-V/0.35-mΩ·cm2 Fully Vertical GaN-on-Si Power Diodes by Selective Removal of Si Substrates and Buffer Layers," IEEE Electron Device Lett., vol. 39, no. 5, pp. 715-718, May 2018, doi: 10.1109/LED.2018.2819642.

[23] C. Liu, R. A. Khadar, and E. Matioli, "GaN-on-Si Quasi-Vertical PowerMOSFETs," IEEE Electron Device Lett., vol. 39, no. 1, pp. 71-74, January 2018, doi: 10.1109/LED.2017.2779445.

[24] R. A. Khadar, C. Liu, R. Soleimanzadeh, and E. Matioli, "Fully Vertical GaN-on-Si power MOSFETs," IEEE Electron Device Lett., vol. 40, no. 3, pp. 443-446, March 2019, doi: 10.1109/LED.2019.2894177.

[25] Y. Zhang, M. Sun, H. Wong, Y. Lin, P. Srivastava, C. Hatem, M. Azize, D. *Piedra*, L. Yu, T. Sumitomo, N. A. de Braga, R. V. Mickevicius, and T. Palacios, "Origin and Control of OFF-State Leakage Current in GaNon-Si Vertical Diodes," IEEE Trans. Electron Devices, vol. 62, no. 7, pp. 2155-2161 July 2015, doi: 10.1109/TED.2015.2426711.

[26] C. Park, N. Hong, D. J. Kim, and K. Lee, "A new junction termination technique using ICP RIE for ideal breakdown voltages," in Proceedings of the 14th International Symposium on Power Semiconductor Devices and Ics, June 2002, pp. 257-260. doi: 10.1109/ISPSD.2002.1016220.

[27] T. T. H. Nguyen, M. Lazar, J. L. Auge, H. Morel, L. V. Phung, and D. Planson, "Vertical Termination Filled with Adequate Dielectric for SiC Devices in HVDC Applications," Mater. Sci. Forum, vol. 858, pp. 982-985, 2016, doi: 10.4028/www.scientific.net/MSF.858.982.

[28] H. Fukushima, S. Usami, M. Ogura, Y. Ando, A. Tanaka, M. Deki, M. Kushimoto, S. Nitta, Y. Honda, and H. Amano, "Vertical GaN p-n diode with deeply etched mesa and the capability of avalanche breakdown," Appl. Phys. Express, vol. 12, no. 2, p. 026502, February 2019, doi: 10.7567/1882-0786/aafdb9.

[29] H. Kim, "Reactive ion etching damage in n-GaN and its recovery by post-etch treatment," Electron. Lett., vol. 44, no. 17, pp. 1037-139 August 2008, doi: 10.1049/el:20081771.

[30] J. A. Spencer, A. L. Mock, A. G. Jacobs, M. Schubert, Y. Zhang, and M. J. Tadjer, "A review of band structure and material properties of transparent conducting and semiconducting oxides: Ga2O3, Al2O3, In2O3, ZnO, SnO2, CdO, NiO, CuO, and Sc2O3," Appl. Phys. Rev., vol. 9, no. 1, p. 011315, March 2022, doi: 10.1063/5.0078037.

[31] M. Xiao, Y. Ma, Z. Du, Y. Qin, K. Liu, K. Cheng, F. Udrea, A. Xie, E. Beam, B. Wang, J. Spencer, M. Tadjer, T. Anderson, H. Wang, and Y. Zhang, "First Demonstration of Vertical Superjunction Diode in GaN," in 2022 International Electron Devices Meeting (IEDM), December 2022, p. 35.6.1-35.6.4. doi: 10.1109/IEDM45625.2022.10019405.

[32] Q. Zhou, M. O. Manasreh, M. Pophristic, S. Guo, and I. T. Ferguson, "Observation of nitrogen vacancy in proton-irradiated AlxGal-xN," Appl. Phys. Lett., vol. 79, no. 18, pp. 2901-293 October 2001, doi: 10.1063/1.1415422.

[33] B. Wang, M. Xiao, J. Spencer, Y. Qin, K. Sasaki, M. J. Tadjer, and Y. Zhang, "2.5 kV Vertical Ga2O3 Schottky Rectifier With Graded Junction Termination Extension," IEEE Electron Device Lett., vol. 44, no. 2, pp. 221-224, February 2023, doi: 10.1109/LED.2022.3229222.

[34] H. Zhou, S. Zeng, J. Zhang, Z. Liu, Q. Feng, S. Xu, J. Zhang, and Y. Hao, "Comprehensive Study and Optimization of Implementing p-NiO in β-Ga2O3 Based Diodes via TCAD Simulation," Crystals, vol. 11, no. 10, p. 1186 September 2021, doi: 10.3390/cryst11101186.

[35] R. Zhang, J. P. Kozak, M. Xiao, J. Liu, and Y. Zhang, "Surge-Energy and Overvoltage Ruggedness of P-Gate GaN HEMTs," IEEE Trans. Power Electron., vol. 35, no. 12, pp. 13409-13419, December 2020, doi: 10.1109/TPEL.2020.2993982.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

What is claimed is:

1. A semiconductor device, comprising:

a substrate;

a first semiconductor region of a first conductivity type having a first doping concentration, the first conductivity type being one of a n-type conductivity or a p-type conductivity, the first semiconductor region including a base surface;

a buffer region positioned between the substrate and the first semiconductor region;

a second semiconductor region of the first conductivity type and having a second doping concentration that is less than the first doping concentration, the second semiconductor region positioned over the base surface of the first semiconductor region;

at least one first device terminal positioned over the base surface of the first semiconductor region;

a third semiconductor region of a second conductivity type, the second conductivity type being the other of the n-type conductivity or the p-type conductivity, disposed over at least one sidewall of the second semiconductor region, a bandgap of the third semiconductor region is greater than or equal to a bandgap of the second semiconductor region; and at least one second device terminal positioned over a top surface of the second semiconductor region and in contact with the third semiconductor region or a doped region formed over or in the second semiconductor region.

2. The semiconductor device of claim 1, wherein the third semiconductor region is disposed over at least half a height of the at least one sidewall of the second semiconductor region.

3. The semiconductor device of claim 1, wherein the third semiconductor region is disposed over the entire height of the at least one sidewall of the second semiconductor region.

4. The semiconductor device of claim 1, wherein the third semiconductor region is also disposed over at least a portion of the at least one second device terminal.

5. The semiconductor device of claim 1, wherein the at least one second device terminal covers at least a portion of the third semiconductor region disposed over at least one sidewall of the second semiconductor region.

6. The semiconductor device of claim 1, further comprising:

a dielectric region disposed over at least a portion of the second semiconductor region and at least a portion of the third semiconductor region, wherein the at least one second device terminal is positioned over at least a portion of the dielectric region.

7. The semiconductor device of claim 1, further comprising:

at least one ion implantation region in the second semiconductor region, wherein the at least one ion implantation region is in contact with both the at least one second device terminal and the third semiconductor region.

8. The semiconductor device of claim 1, further comprising:

a comb structure formed in the second semiconductor region in contact with the at least one second device terminal, wherein the comb structure is formed using a material having the second conductivity type, and wherein a bandgap of the comb structure is greater than or equal to the bandgap of the second semiconductor region.

9. The semiconductor device of claim 8, further comprising:

a dielectric region disposed over at least a portion of the second semiconductor region and at least a portion of the third semiconductor region, wherein the at least one second device terminal is positioned over at least a portion of the dielectric region.

10. The semiconductor device of claim 8, further comprising:

at least one ion implantation region in the second semiconductor region, wherein the at least one ion implantation region is in contact with both the at least one second device terminal and the third semiconductor region.

11. The semiconductor device of claim 1, further comprising:

a fourth semiconductor region of the second conductivity type positioned between the second semiconductor region and the at least one second device terminal.

12. The semiconductor device of claim 1, wherein the semiconductor device is a metal-oxide-semiconductor-field-effect-transistor (MOSFET), and wherein the at least one first device terminal includes a drain terminal and the at least one second device terminal includes a source terminal and a gate terminal.

13. The semiconductor device of claim 1, wherein the semiconductor device is a junction-field-effect-transistor (JFET), and wherein the at least one first device terminal includes a drain terminal and the at least one second device terminal includes a source terminal and a gate terminal.

14. The semiconductor device of claim 1, wherein the first semiconductor region and the second semiconductor region include gallium-nitride.

15. The semiconductor device of claim 14, wherein the third semiconductor region includes gallium-nitride.

* * * * *